United States Patent
Brandmaier

Patent Number: 5,414,307
Date of Patent: May 9, 1995

[54] POWER RESET CIRCUIT

[75] Inventor: Carollynn Brandmaier, Morris Township, Morris County, N.J.

[73] Assignee: AT&T Corp., Murray Hill, N.J.

[21] Appl. No.: 954,718

[22] Filed: Sep. 30, 1992

[51] Int. Cl.6 ...................... H03K 19/02; H03K 17/16
[52] U.S. Cl. ...................................... 327/143; 327/198
[58] Field of Search .................. 307/272.3, 296.4, 592, 307/593

[56] References Cited

U.S. PATENT DOCUMENTS

| | | | |
|---|---|---|---|
| 4,365,174 | 12/1982 | Kucharewski | 307/593 |
| 4,434,403 | 2/1984 | Chang | 328/120 |
| 4,499,875 | 2/1985 | Katayama et al. | 123/416 |
| 4,633,107 | 12/1986 | Norsworthy | 307/592 |
| 4,902,907 | 2/1990 | Haga et al. | 307/272.3 |
| 5,180,926 | 1/1993 | Shripek | 307/272.3 |
| 5,212,412 | 5/1993 | Atriss et al. | 307/592 |

Primary Examiner—Willis R. Wolfe
Attorney, Agent, or Firm—Lester H. Birnbaum

[57] ABSTRACT

Disclosed is a circuit for ensuring proper reset of a microprocessor. A low voltage detector is triggered, and the resulting pulse is detected and captured. Timing circuitry then waits for a clock signal in order to apply an appropriate reset pulse to the microprocessor.

8 Claims, 2 Drawing Sheets

POWER RESET CIRCUIT

BACKGROUND OF THE INVENTION

This invention relates to circuit packs which include a microprocessor, and, in particular, to a circuit for applying a reset pulse to the microprocessor.

Generally, when circuit packs are plugged into a backplane, and at other times, a reset pulse must be applied to the microprocessors included in the pack. For example, a Transmit-Receive Unit (TRU) circuit pack, which is part of a Remote Terminal (RT) in a digital loop carder transmission system, typically includes two microprocessors which must be reset.

In a typical prior art approach, a power-up reset circuit would be :. triggered by the ramped supply voltage applied to the pack, and this pulse would reset the microprocessors. Such reset circuits typically require a ramp of 0 to 4 volts in less than 100 microseconds to be properly triggered. However, in Subscriber Loop Carder (SLC®) systems, the ramp can be 20 to 30 milliseconds. Such a slow ramp has caused the power-up reset to trigger at too low a voltage to reset the microprocessors.

It is, therefore, an object of the invention to provide a reset circuit for a microprocessor which ensures a reset in the event of a slow ramp-up in voltage of the power supplied to the circuit.

SUMMARY OF THE INVENTION

This and other objects are achieved in accordance with the invention which is a circuit comprising a low voltage detector capable of providing an output when a threshold voltage is applied thereto. Means are coupled to the detector for capturing the output of the detector and providing a reset pulse in response thereto. Means are also included for providing clock pulses to the capturing means so that the reset pulse is provided at some predetermined number of clock pulses subsequent to the receipt of the detector output. A microprocessor is also coupled to the capture means.

BRIEF DESCRIPTION OF THE DRAWING

These and other features of the invention are delineated in detail in the following description. In the drawing.

DETAILED DESCRIPTION

Figure 1:
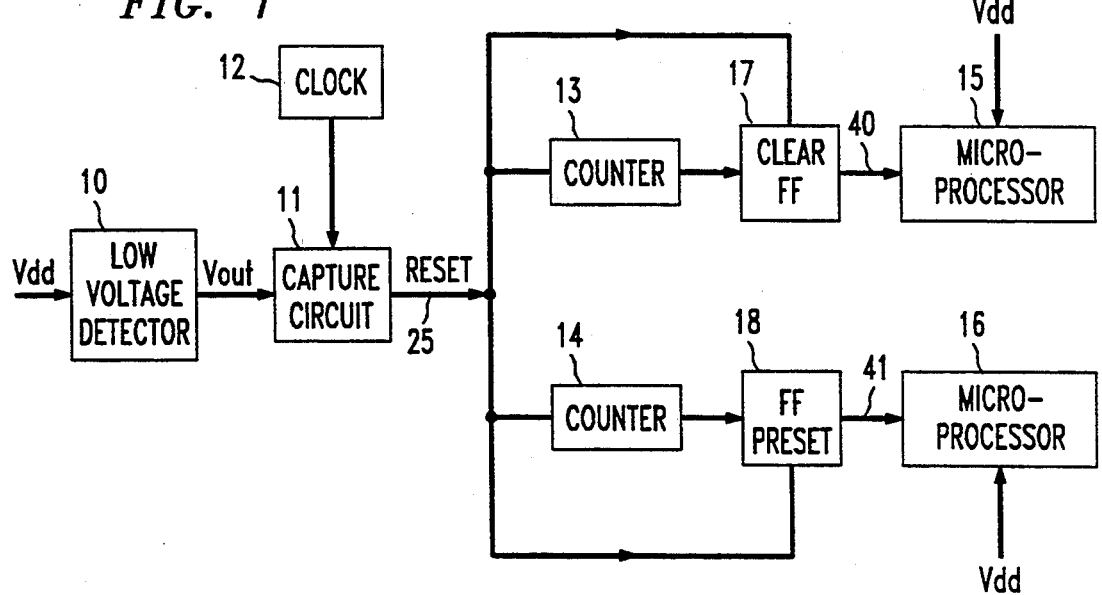
FIG. 1 is a block diagram of the circuit in accordance with an embodiment of the invention.

FIG. 1 illustrates the basic components of the reset circuit. When the circuit board including this circuit is plugged into the backplane (not shown), the circuit will receive a ramped input voltage ($V_{dd}$) from the power source (not shown) which drives all the boards coupled to the backplane. This input voltage is received by a low voltage detector 10. The low voltage detector 10 will produce no output until the input voltage, $V_{dd}$, reaches a certain threshold value. Once the threshold is reached, the output of the detector, $V_{out}$, will be proportional to the input, $V_{dd}$. In this particular example, the detector threshold has chosen to be approximately 3.7 volts. The detector will, typically, exhibit hysteresis of approximately 350 mV to prevent noise spikes from affecting the output. The output of the detector, 10, below threshold will be zero independent of the slope of the ramp exhibited by $V_{dd}$.

Figure 2:
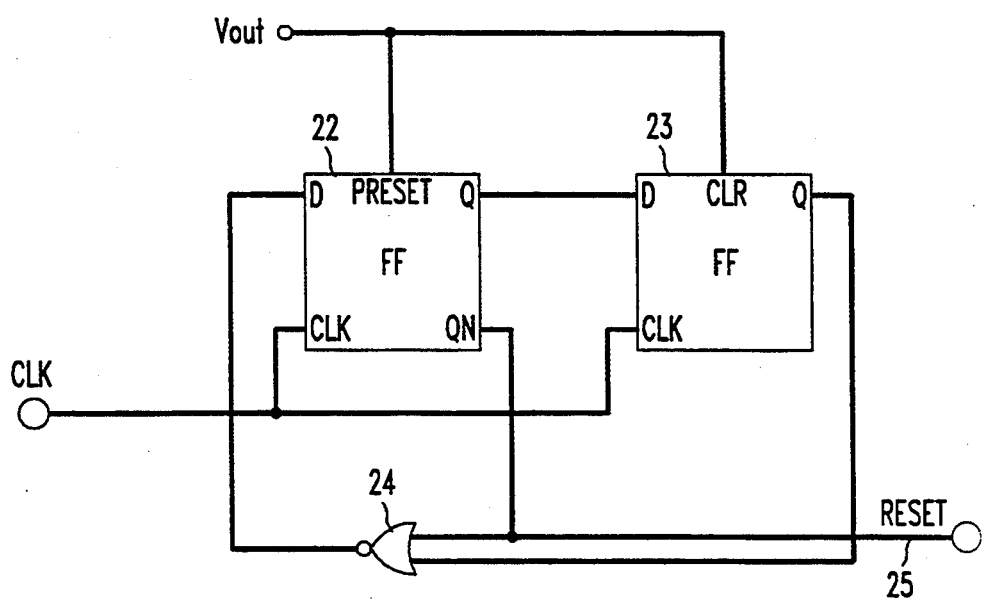
FIG. 2 is a more detailed schematic diagram of a portion of the circuit of FIG. 1.

The output of the detector, 10, is coupled to a capture circuit 11. The capture circuit is shown in more detail in the block diagram of FIG. 2. The output, $V_{out}$ from the low voltage detector is coupled to the preset and clear inputs of flip flop circuits, 22 and 23, respectively. Each flip flop circuit also receives a clock signal, in this example, 4 MHz, from a clock, 12 of FIG. 1, which is typically located at a voltage controlled oscillator on the circuit pack.

The Q output of flip flop 22 is coupled to the data input of the flip flop 23. The Q output of flip flop 23 is coupled to one input of a NOR gate 24, whose output is coupled at the data input of flip flop 22. The $Q_N$ output of flip flop 22, which provides an output that is the inverse of the Q output, is also coupled to an input of NOR gate 24, as well as being coupled to line 25 where a RESET pulse appears in a manner to be described.

Returning to FIG. 1, the RESET pulse is coupled to two counters, 13 and 14. Each counter is coupled to an associated microprocessor 15 and 16 through a flip flop, 17 and 18, respectively. The reset lead, 25, is also coupled to the clear input of flip flop 17 and the preset input of flip flop 18.

Figure 3:
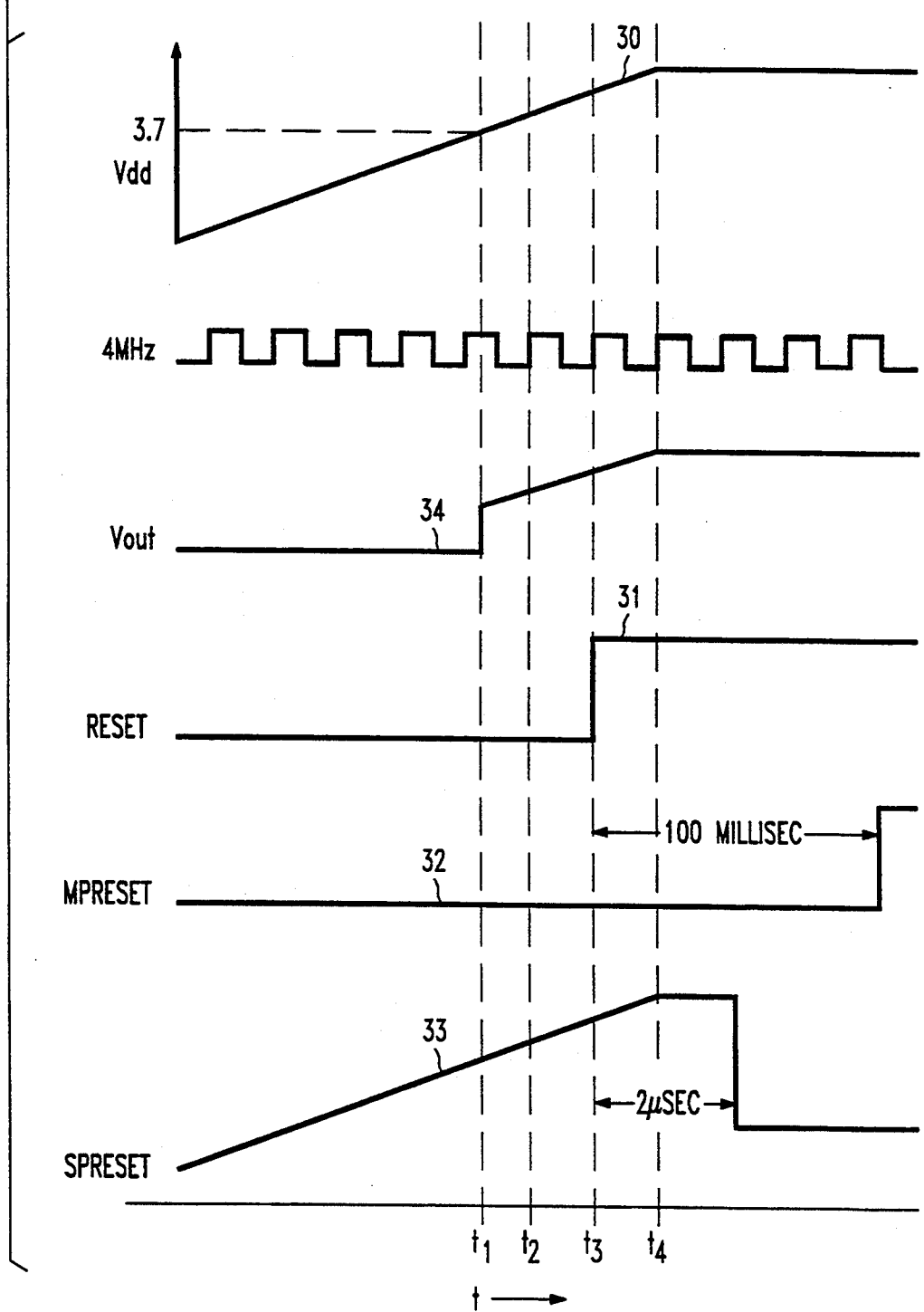
FIG. 3 illustrates the relationships of waveforms involved in resetting of microprocessors in accordance with the same embodiment.

The operation of the reset circuit will now be described with further reference to the waveforms illustrated in FIG. 3. The input to the low voltage detector, $V_{dd}$, is illustrated as curve 30, the reset pulse on the lead 25 is illustrated as curve 31, the voltages on the leads 40 and 41 coupled to the microprocessors 15 and 16 are illustrated as curves 32 and 33, respectively, and the voltage from the low voltage detector, $V_{out}$, is illustrated as curve 34.

As the voltage, $V_{dd}$, ramps up, the $Q_N$ output of flip flop 22 will be held at zero, which will apply a zero to the clear input of flip flop 17 and to the preset input of flip flop 18. This, in turn, will cause lead 40 to remain at zero (curve 32) and lead 41 to follow the ramp voltage (curve 33). $V_{out}$, which is a zero, is applied to the preset input of flip flop 22 and to the clear input of flip flop 23. A logical one will be produced at the output of NOR gate 24 resulting from the combination of a zero from the $Q_N$ output of flip flop 22 and a zero from the Q output of flip flop 23. This NOR gate output will be applied to the D input of flip flop 22. This occurs until time $t_1$.

When the threshold voltage is reached, $V_{out}$ will become a one. Thus, at the rising edge of the next clock pulse, $t_2$, the one at the D input of flip flop. 22 will appear at the Q output of flip flop 22 which is applied to the D input of flip flop 23. The logical one previously appearing at the D input of the flip flop 23 will appear at the Q output of flip flop 23. Since the Q output of flip flop 23 is now one, while the $Q_N$ output Of flip flop 22 remains at zero, the output of NOR gate 24 is now a logical zero applied to the input of flip flop 22.

Thus, at the next clock pulse, $t_3$, the zero at the D input of flip flop 22 is shifted to the Q output of flip flop 22 and the logical one which was previously applied to the D input of flip flop 23 is shifted to the Q output of flip flop 23. Since the Q output of flip flop 22 is now a logical zero, a logical one will appear at the $Q_N$ output of flip flop 22. This $Q_N$ output will provide a reset pulse (curve 31) on lead 25 coupled to microprocessors 15 and 16. The output of NOR gate 24 will again be zero due to the combination of one at the $Q_N$ output of flip flop 22 and one at the Q output of flip flop 23, and this zero will be applied to the D input of flip flop 22. At the rising edge of the next clock pulse, $t_4$, the zero of the D input of flip flop 22 is shifted to the Q output, and the output of the NOR gate 24 will continue to be zero, thus stabilizing the circuit since the $Q_N$ output of flip flop 22 will always be a one and the Q output of flip flop 23 will always be a zero until the supply voltage dips below a predetermined value, below threshold, (e.g., 3.35 volts) triggering the output of the low voltage detector ($V_{out}$) to go to zero.

Once a transition from zero (active) to 1 (inactive) appears on reset lead 25 (at time $t_3$) the counters 13 and 14 will begin counting from that point the necessary time intervals to keep a reset condition applied to the microprocessor. In the case of microprocessor 15, the reset condition (a low state) will be applied for 100 milliseconds, and in the case of microprocessor 16, the reset condition (a high state) will be applied for 2 $\mu$sec after a reset pulse (31) appears.

It will be noted that the application of reset conditions (curves 32 and 33) is guaranteed to occur at a sufficiently high voltage since the counters will begin counting only after a combination of a high voltage (threshold voltage of the detector 10) and the passage of a certain number of clock pulses (two in the example).

Various modifications will become apparent to those skilled in the art. All such variations which basically rely on the teachings through which the invention has advanced the an are properly considered within the scope of the invention.

I claim:

1. A circuit comprising
    a low voltage detector capable of providing an output when a threshold voltage is applied thereto;
    means coupled to the detector for capturing the output of the detector and providing a reset pulse in response thereto;
    means for providing clock pulses to the capturing means;
    means for delaying the reset pulse for some predetermined number of clock pulses subsequent to the receipt of the detector output; and
    a microprocessor coupled to the capture means.

2. The circuit according to claim 1 further comprising a counter coupled between the microprocessor and the capture means.

3. The circuit according to claim 1 wherein the capture means includes a pair of tandem coupled flip flop circuits, a first flip flop having a preset terminal coupled to the detector output and a second flip flop having a clear terminal coupled to the detector output.

4. The circuit according to claim 3 wherein outputs of the first and second flip flops are coupled through a logic gate to a data input of the first flip flop.

5. The circuit according to claim 4 wherein the logic gate is a NOR gate.

6. The circuit according to claim 4 wherein the Q output of the first flip flop is coupled to the data input of the second flip flop, and the inverse of the Q output is coupled to said logic gate.

7. The circuit according to claim 2 further comprising a flip flop circuit coupled between the counter and microprocessor and having a clear input coupled to the capture means so that the voltage applied to the microprocessor remains at a low state for a predetermined time subsequent to the reset pulse from the capture means.

8. The circuit according to claim 2 further comprising a flip flop circuit coupled between the counter and the microprocessor and having a preset input coupled to the capture means so that the voltage applied to the microprocessor rises to a high state and remains at that state for a predetermined time subsequent to the reset pulse from the capture means.

* * * * *